United States Patent [19]

Joy et al.

[11] Patent Number: 4,688,069
[45] Date of Patent: Aug. 18, 1987

[54] ISOLATION FOR HIGH DENSITY INTEGRATED CIRCUITS

[75] Inventors: Richard C. Joy, Beacon; Bernard M. Kemlage, Kingston, both of N.Y.; John L. Mauer, IV, South Kent, Conn.

[73] Assignee: International Business Machines Corporation, Armonk, N.Y.

[21] Appl. No.: 806,060

[22] Filed: Dec. 6, 1985

Related U.S. Application Data

[63] Continuation of Ser. No. 592,060, Mar. 22, 1984.

[51] Int. Cl.$^4$ ............................................. H01L 29/72
[52] U.S. Cl. ....................................... 357/34; 357/49; 357/59; 357/43
[58] Field of Search ...................... 357/49, 47, 48, 43, 357/50, 596 K; 156/643; 148/1.5

[56] References Cited

U.S. PATENT DOCUMENTS

| | | | |
|---|---|---|---|
| 4,140,558 | 2/1979 | Murphy et al. | 357/49 X |
| 4,191,964 | 3/1980 | Kant | 357/59 K |
| 4,256,514 | 3/1981 | Pogge | 148/1.5 |
| 4,309,716 | 1/1982 | El-Kareh | 357/50 |
| 4,353,086 | 10/1982 | Jaccodine et al. | 357/49 X |
| 4,446,476 | 5/1984 | Isaac et al. | 357/48 X |
| 4,477,310 | 10/1984 | Park et al. | 357/47 X |
| 4,520,552 | 6/1985 | Arnould et al. | 357/59 G X |
| 4,546,366 | 10/1985 | Buchanan | 357/59 K X |

Primary Examiner—Andrew J. James
Assistant Examiner—William A. Mintel
Attorney, Agent, or Firm—George O. Saile; Steven J. Meyers

[57] ABSTRACT

An integrated circuit structure having substrate contacts formed as a part of the isolation structure and the method to form such structure is described. The integrated circuit structure is composed of a monocrystalline silicon body having a pattern of dielectric isolation surrounding regions of the monocrystalline silicon in the body. The dielectric isolation pattern includes a recessed dielectric portion at and just below the surface of the integrated circuit and a deep portion which extends through the recessed dielectric portion and extends further into the monocrystalline silicon body than the recessed portion. A highly doped polycrystalline silicon substrate contact is located within the deep portion of the pattern of isolation. The substrate contact extends from the surface of the pattern of isolation down to the bottom of the deep portion of the isolation where the contact electrically connects to the silicon body. Any of a variety of integrated circuit device structures may be incorporated within the monocrystalline silicon regions. These devices include bipolar transistors, field effect transistors, capacitors, diodes, resistors and the like.

7 Claims, 4 Drawing Figures

ISOLATION FOR HIGH DENSITY INTEGRATED CIRCUITS

CROSS-REFERENCES TO RELATED PATENT APPLICATION

This application is a continuation of application Ser. No. 592,060 filed Mar. 22, 1984.

Patent application Ser. No. 591,704 filed like date entitled "Isolation for High Density Integrated Circuits", by R. C. Joy, B. M. Kemlage and J. L. Mauer IV.

Patent application Ser. No. 296,933, now U.S. Pat. No. 4,454,647.

TECHNICAL FIELD

The invention relates to methods for dielectrically isolating regions of monocrystalline silicon from other regions of monocrystalline silicon and more particularly to techniques which provide isolation having substrate contacts within its regions for high density integrated circuit structures.

DESCRIPTION OF THE PRIOR ART

In the monolithic integrated circuit technology, it is usually necessary to isolate various active and passive elements from one another in the integrated circuit structure. These devices have been isolated by backbiasing PN junctions, partial dielectric isolation and complete dielectric isolation. The dielectric materials used have been silicon dioxide and the like. The preferred isolation for these active devices and circuits is some form of dielectric isolation which may include a combination with PN junction isolation. The dielectric isolation has the substantial advantage over the PN junction isolation because it allows the abutting of the circuit elements against the isolation and thereby results in greater density of packing of the active and passive devices on the integrated circuit chip.

One form of dielectric isolation involves the formation of grooves or depressions in silicon where the isolation regions are to be formed. During the groove formation, the remainder of the silicon surface is protected by a protective film which is substantially unaffected by the silicon etch used to form the grooves. The usual protective layer is a silicon nitride, silicon dioxide sandwich layer. Following the formation of the grooves by conventional chemical etching, the silicon body is subjected to a conventional thermal oxidation step whereby the silicon in the groove area is oxidized and the silicon dioxide fills up the groove as well as oxidizing further into the silicon to form the isolation region. One of the major problems with this process is what is known as "bird's beak".

The "bird's beak" is a non-planar silicon dioxide formation at the top periphery of the groove and is caused by the lateral oxidation underneath the silicon nitride layer. Since the oxidation of a specific thickness of silicon requires an almost equivalent amount of free space to expand into, and since the $SiO_2/Si_3N_4$ limits the unrestricted expansion, the result is an up-pushing of the silicon dioxide/silicon nitride at the edge of the groove. The final consequence of this is a general stress in the perimeter region of the groove as well as difficulties in subsequently achieving good abutted diffusions against the vertical portion of the silicon dioxide. This nonabutting capability defeats to some extent a major benefit of the original purpose of the silicon dioxide region. This process is described more fully by E. Kooi U.S. Pat. No. 3,970,486, Clevenger U.S. Pat. No. 3,534,234, Peltzer U.S. Pat. No. 3,648,125 and I. Magdo et. al., patent application Ser. No. 150,609, filed June 7, 1971. Efforts to minimize this "bird's beak" problem have been extensive and include J. A. Appels et. al. U.S. Pat. No. 3,900,350, P. W. D. Webb U.S. Pat. No. 3,958,040, I. Antipov U.S. Pat. No. 3,961,990, B-C. Feng et. al. U.S. Pat. No. 3,966,514, I. Magdo et. al. U.S. Pat. No. 4,002,511, and K. G. Bartlett et. al. U.S. Pat. No. 4,170,492.

An alternate to recessed oxide isolation is deep dielectric isolation which involves the formation of rectangular grooves made in the Hochberg U.S. Pat. No. 3,966,577, T. Kaji et. al. U.S. Pat. No. 3,997,378, J. A. Bondur et. al. U.S. Pat. No. 4,104,086 and S. A. Abbas, IBM TDB Vol. 20, No. 1, p. 144, June 1977 entitled "Recessed Oxide Isolation Process", by reactive ion etching techniques and filling the grooves to form the isolation for the silicon regions. The groove filling techniques all involve either thermal oxidation and/or chemical vapor deposition techniques and extensively use silicon dioxide as the dielectric isolation.

In bipolar circuits, substrate contacts are used to apply a voltage to the substrate of the lowest possible potential of the circuit. The current swings in the substrate due to circuit operation are, thereby, given a path so that the collector/substrate junctions are discharged. This current removal reduces the collector/substrate capacitance and improves the performance of the circuit. H. B. Pogge et al. U.S. Pat. No. 4,256,514 describes one method of forming such substrate contacts.

For field effect transistor circuits a similar phenomena occurs. The operation of these circuits produce capacitive coupling to the substrate. If these current and voltage swings are not stabilized by a substrate contact, the operation of one circuit will affect the threshhold voltage of another circuit with potential circuit failure as a result.

It is, in general, easier and more reliable to provide substrate contacts on the same side of the semiconductor chip as the circuits when the chip is to be mounted on a module with solder balls. This eliminates the need for discrete wire bonding to the back of the chip. Top side contacts are normally performed through the utilization of localized subcollector and substrate contact diffusions before epitaxy and surface diffusions for substrate contacts after epitaxy to provide a shorting path to the substrate.

SUMMARY OF THE PRESENT INVENTION

In order to reduce device size and processing complexity, the present structure utilizes a blanket subcollector diffusion with the subcollector being defined by the vertical dielectric isolation trench. Since no localized substrate contact diffusion is performed before epitaxy there is no path through the subcollector to the substrate for contact except for the vertical isolation structure. The bottom of the trench is opened and the trench filled with P+ doped polysilicon to provide this shorting path to the substrate.

An integrated circuit structure having substrate contacts formed as a part of the isolation structure is described. The integrated circuit structure is composed of a monocrystalline silicon body having a pattern of dielectric isolation surrounding regions of the monocrystalline silicon in the body. The dielectric isolation pattern includes a recessed dielectric portion at and just below the surface of the integrated circuit and a deep portion which extends through the recessed dielectric portion and extends further into the monocrystalline silicon body than the recessed portion. A highly doped polycrystalline silicon substrate contact is located within the deep portion of the pattern of isolation. The substrate contact extends from the surface of the pattern of isolation down to the bottom of the deep portion of the isolation where the contact electrically connects to the silicon body. Any of a variety of integrated circuit device structures may be incorporated within the monocrystalline silicon regions. These devices include bipolar transistors, field effect transistors, capacitors, diodes, resistors and the like.

The pattern of dielectric isolation for the integrated circuit structure having substrate contacts within the isolation structure may be made using a series of method steps as described as follows. A masking layer is formed over a major surface of a monocrystalline substrate. A pattern is opened in this masking layer to the major surface wherein the isolation structure is desired. The exposed monocrystalline substrate is oxidized to produce the recessed isolation structure. Prior to the oxidation, an etch of the pattern in the silicon will aid in the formation of a more planar recessed oxidation structure. The masking layer is removed. A layer of reactive ion etch stop material and a new masking layer over this major surface are then formed. A pattern is formed in the masking layer and the etch stop layer in the recessed isolation structure wherein the deep portion of isolation and the substrate contacts are to be located. A pattern of trenches having substantially vertical sidewalls are formed through the openings and through the recessed isolation structure and into monocrystalline silicon thereunder. An insulating layer is formed upon the surfaces of the trenches. The insulating layer is removed from the bottom surfaces of the trenches by anisotropic reactive ion etching process. A layer of polycrystalline silicon is deposited over the substrate to fill the trenches and form the substrate contact which electrically connects the major surface of the silicon body to the under side of the isolation structure. The major surface of the substrate is planarized by an etching process which substantially removes the layer of polycrystalline silicon except from the confines of the trenches. Devices are now formed in the monocrystalline silicon regions within the pattern of dielectric isolation.

The isolation structure provided herein allows for the abutting of the subcollector, extrinsic base, emitter, and resistor junctions, etc., to dielectric material. The abutting of junctions reduces the total junction area required which in turn reduces the capacitance associated with each device, thereby, improving performance. In addition the distance between devices can be reduced leading to increased circuit density and improved performance. Finally, the elimination of all lithography steps prior to epitaxy improves device yields due to a decrease in epitaxial defect density caused by pre-epitaxial processing.

DESCRIPTION OF THE PREFERRED EMBODIMENTS

Figure 1:
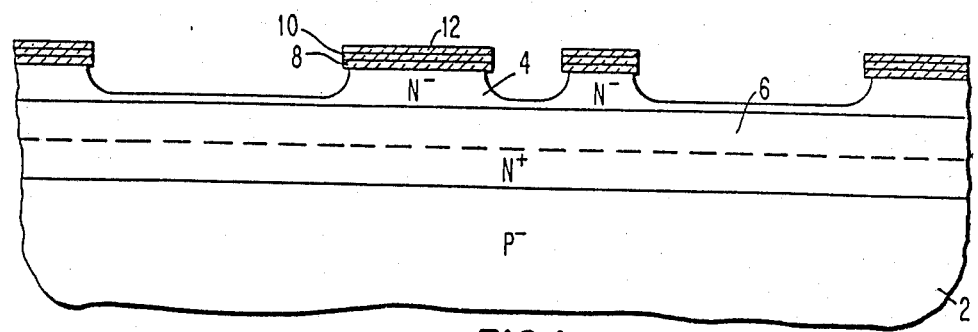
FIGS. 1 through 4 illustrate one method embodiment of forming the integrated circuit structure having substrate contacts and the resulting structure according to the present invention.

Referring now more particularly to FIG. 1, there is shown a semiconductor body 2 of a P— conductivity type. The present example describes the methods for making a NPN bipolar transistor structure. Opposite conductivity types would be used to make a PNP bipolar transistor. Semiconductor body is typically <100> crystallographic oriented silicon and has a resistivity in the order of 10 to 20 ohm-centimeter. The silicon body 2 is subjected to a blanket diffusion or ion implantation step to form a subcollector region on a major surface of the semiconductor body 2. For an NPN type bipolar transistor, N type impurities may be thermally diffused by conventional techniques to form a region having a surface concentration level of typically $5 \times 10^{20}$ atoms/cc. The N type impurity may be, for example, arsenic or antimony. Alternatively, an ion implantation method can be utilized to form this subcollector region utilizing a thermal screen silicon dioxide on a major surface of the silicon body followed by the subjection of an implantation, for example, arsenic, of a dosage of $1.5 \times 10^{16}$ per square centimeter and an energy level of 50 KEV. The subcollector ion implantation is driven in at a temperature of, for example, 1100° C. to a thickness of about 650 nm. The silicon dioxide on the major surface is removed using a hydrofluoric acid etching solution.

The silicon body is then placed in an epitaxial growth chamber and a monocrystalline silicon layer 4 is grown upon the principal surface of the body. The dashed line indicates the original demarcation between the substrate 2 and the epitaxial layer 4. The subcollector region expands into the epitaxial layer during the epitaxial growth to form the N type subcollector region 6. This epitaxial growth is done by conventional techniques such as the use of $SiCl_4/H_2$ or $SiH_4/H_2$ mixtures at growth temperatures of about 1000° C. to 1200° C. The thickness of the epitaxial layer is typically 2 micrometers but may be in the range of 0.5 to 10 micrometers.

The next series of steps is the formation of the recessed dielectric isolation portion of the isolation pattern. The isolation pattern is in two parts, a recessed dielectric portion at the surface of the integrated circuit and a deep portion which extends through the recessed portion and extends into the monocrystalline silicon substrate. One preferred way of forming the recessed dielectric portion is described in patent application Ser. No. 288,599 entitled "Method for Controlling Nonuniformity in Recessed Oxide Isolation" by B. M. Kemlage and assigned to the same assignee as the present patent application. Briefly, this pattern can be formed by depositing a silicon-oxynitride layer 8 over the epitaxial layer surface. The silicon-oxynitride is formed by the chemical vapor deposition method using silane, ammonia and nitrous oxide gases at a temperature of 800° C. and to a thickness of, for example, 40 nm. The refractive index of the silicon-oxynitride is about 1.67. A second chemical vapor deposited coating 10 of silicon nitride is deposited over the coating 8 using silane and ammonia gases at a temperature of 800° C. and to a thickness of about 40 nm. A silicon dioxide layer 12 is deposited over the silicon nitride layer from a silane and nitrous oxide gas ambient at a temperature of about 800° C. to a thickness of about 100 nm. The composite layers 8, 10 and 12 are patterned using standard lithography and etching techniques to form openings therein where it is desired to have the dielectric isolation pattern in the monocrystalline silicon body. Either chemical, plasma, or reactive ion etching can be utilized to remove the layers 8, 10 and 12. It is however preferred to use $CF_4$ and $H_2$ reactive ion etching ambient to remove the silicon dioxide, silicon nitride and silicon oxynitride layers down to the monocrystalline silicon surface. It is now preferred to etch the silicon by a reactive ion etching process which uses a $CBrF_3/O_2$ ambient. Other etching techniques, of course, can be utilized. It is preferred to etch about 400 nm of silicon. The resist is removed from the surface of the layer 12 utilizing for example, an oxygen asher process and hot sulfuric/nitric chemical etching. The result of this process sequence is shown in FIG. 1.

The FIG. 1 structure is placed in an oxidation ambient of oxygen and/or steam plus hydrogen chloride gas at about 1000° C. to produce preferably a thickness of about 1 micrometers of silicon dioxide. The use of the silicon-oxynitride layer as a mask as described in the above patent application has the advantage of substantially eliminating the "bird's beak" produced by the oxidation step and reduces the "bird's head" to acceptable levels. The resulting recessed dielectric portion of the isolation is indicated at 14.

Figure 2:
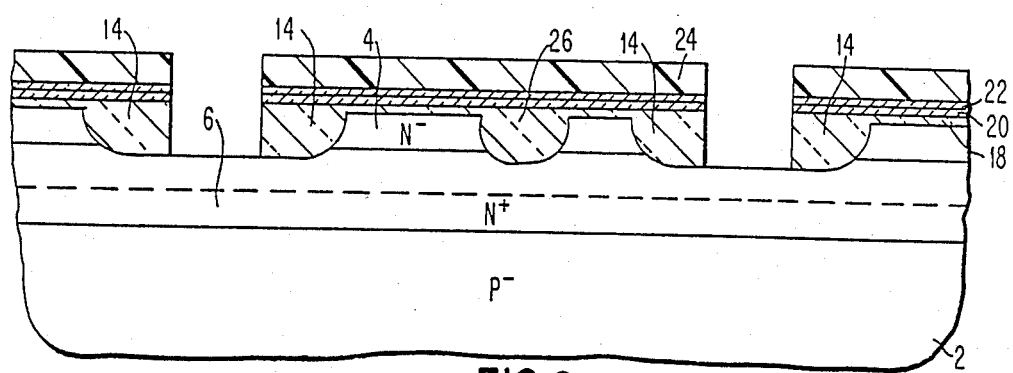
Figure 3:
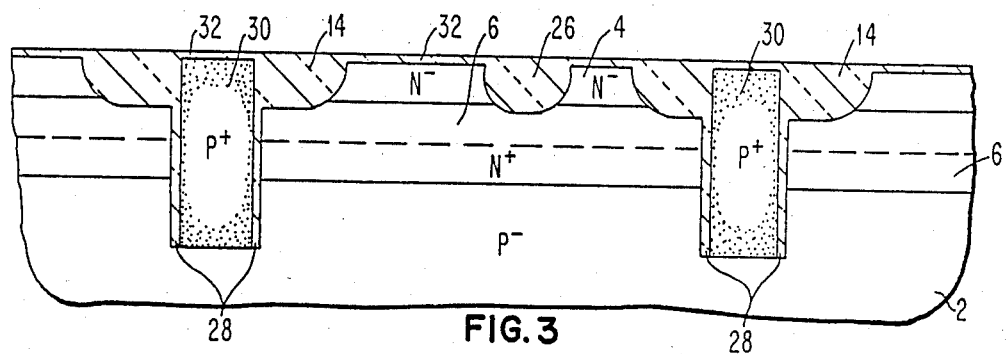

Referring now more particularly to FIGS. 2 and 3 the process continues in the formation of the pattern of dielectric isolation to produce the deep trench portion. The recessed dielectric portion mask composed of silicon-oxynitride layer 8, silicon nitride layer 10 and silicon dioxide layer 12 is now removed using a buffered hydrofluoric acid dip to remove the silicon dioxide layer, and a phosphoric acid etch at a temperature of about 165° C. for about 120 minutes to remove the silicon nitride layer 10 and silicon-oxynitride layer 8. After conventional cleaning procedures, the surface is now ready for the preparation of the mask for the deep isolation pattern. A silicon dioxide layer 18 is thermally grown at a temperature of about 900° C. in oxygen or oxygen/steam plus hydrogen chloride gas to a thickness of about 100 nm. A silicon nitride layer 20 is deposited by chemical vapor deposition using a gas mixture of silane and ammonia at a temperature of 800° C. to a thickness of about 250 nm. A silicon dioxide layer 22 is deposited over the silicon nitride layer 20 by chemical vapor deposition using, for example, silane and nitrous oxide at a temperature of about 935° C. to a thickness of, for example, 1.4 micrometers.

A resist mask 24 is then formed by blanket depositing a resist coating over the major surface containing the recessed dielectric pattern therein, optically exposing the resist, and developing and baking the resist to form the mask 24. The pattern of openings in the mask are chosen so that the openings are located over the pattern of recessed dielectric regions wherein it is desired to have a deep trench portion of isolation and a substrate contact. Certain regions such as the portion 26 of the recessed dielectric pattern which acts as a surface isolation between the collector reach-through and the base-emitter regions of a bipolar transistor do not have the deep trench portion of the isolation as seen in FIG. 3. The mask 24 is now utilized to etch through the layers 22, 20, 18 and the recessed dielectric region 14. This can be done by various conventional etching techniques, such as chemical, reactive ion etching or plasma, however it is preferred to use the reactive ion etching technique which results in substantially vertical sidewalls to the deep trench. A preferred reactive ion etching ambient is carbon tetrafluoride/hydrogen. With this gaseous ambient it takes about 35 minutes to etch through the 1.4 micrometers of silicon dioxide 22, 12 minute to etch through the 25 nm silicon nitride and 25 minutes to etch through the 1 micrometer of silicon dioxide down to the silicon surface underneath the recessed dielectric pattern 14. The resist mask 24 is now removed using typically an oxygen asher and a hot sulfuric/nitric acid solution. The silicon deep trench is formed using any etching technique which will provide substantially vertical sidewalls. It is preferred to use the reactive ion etching process with $CBrF_3/O_2$ to produce a trench of, for example, a 2 to 6 micrometers in depth and preferably about 3.5 micrometers.

The polysilicon filling of the deep trench to complete the pattern of dielectric isolation begins by thermally oxidizing the surfaces of the trench by placing the structure in an ambient of oxygen or oxygen and steam plus hydrogen chloride gas at 1000° C. until a thickness of about 100 nm of the silicon dioxide layer 28 has been formed. The remaining thickness of the silicon dioxide layer 28 is formed by a means of chemical vapor deposition of silicon dioxide in an ambient of silane and nitrous oxide at about 800° C. to an additional thickness of 400 nm to produce a total thickness of layer 28 of about 500 nm. It is preferred to utilize the additional chemical vapor deposition method for forming silicon dioxide because it takes a shorter period of time than does the thermally grown silicon dioxide process for the full thickness. In addition, thermally grown silicon dioxide of greater than 200 nm in a deep trench produces an increased defect density in the silicon monocrystalline substrate. It is also possible to put down by chemical vapor deposition or otherwise a silicon nitride or other layer over this silicon dioxide layer 28. However, it is preferred not to use such a coating in the present process. The structure is now placed in a reactive ion etching or other anisotropic etching ambient to remove the silicon dioxide from the horizontal surfaces of the structure and in particular the silicon dioxide layer 28 on the bottom of the deep trench. The ambient preferred is a $CF_4/H_2$ ambient for effecting this removal of layer 28 from the bottom of the trench.

The trenches are now filled with polycrystalline silicon. It is preferred that the polycrystalline silicon is deposited in a two-step process. Intrinsic polycrystalline silicon is first deposited from a silane ambient at 625° C. for about 20 minutes to a thickness of 200 nm. The temperature of the system is then raised to 1000° C. in a $SiCl_4/H_2$ system for the principal polycrystalline silicon deposition which includes, for example, sufficient boron doping to give the resulting region a P+ doping level. The thickness of the polycrystalline silicon deposition is of the order of 3 micrometers. The result of these two depositions is the filling of the trenches with layer 30 of P+ polysilicon and the deposition of P+ polycrystalline silicon over the major surface of the structure. It is now necessary to remove the polycrystalline silicon on the surface of the structure. This is preferably done by a standard reactive ion etching process. The etching will stop at the silicon dioxide surface which covers the major surface.

The mask 18, 20 and 22 for the deep trench isolation formation is now removed. The silicon dioxide layer is removed with a carbon tetrafluoride/hydrogen RIE, the silicon nitride layer with phosphoric acid at about 85° C. and the silicon dioxide layer 22 removed using carbon tetrafluoride/hydrogen ambient.

It is now necessary to prepare the major surface of the body for subsequent device formations in the monocrystalline silicon regions. The structure is thermally oxidized to form a silicon dioxide layer of about 50 nm in a oxygen or oxygen/steam plus hydrogen chloride gas at 900° C. The silicon dioxide layer 32 is now completed using a chemical vapor deposition of silicon dioxide in a silane/nitrous oxide ambient at 800° C. This thickness is typically of the order of 300 nm for a total layer 32 thickness of about 350 nm. The resulting structure is shown in FIG. 3.

Figure 4:
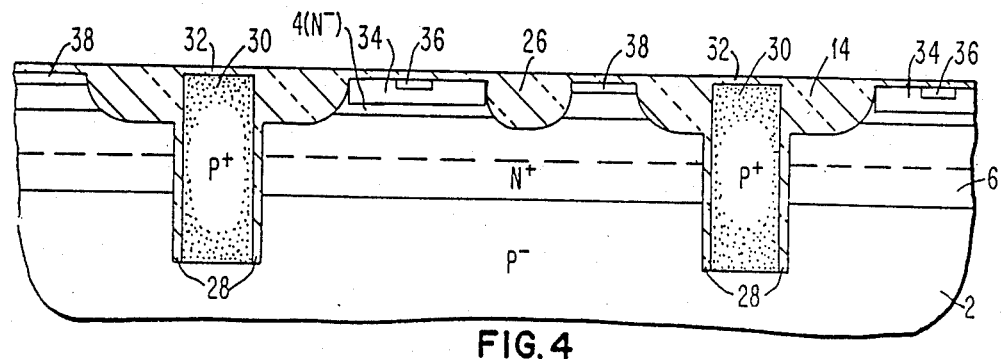

The process for making high density bipolar transistor integrated circuit is completed with the FIG. 4 structure. The base region is 34, the emitter region is 36 and the collector reach-through region is 38. These regions are formed by the conventional lithography, etching, ion implantation and/or diffusion techniques which are well known. In the present example of formation of NPN bipolar transistors, the regions 36 and 38 are of N type and base region 34 is P type. It is, of course, well understood that the substitution of all P type for N type regions and N type regions for P type regions will provide a PNP bipolar type vertical transistor integrated circuit.

While it is not illustrated in the drawings, the next series of steps will involve the formation of the metallurgy interconnection of the various elements of the integrated circuit utilizing the conventional metal and insulator deposition plus lithography and etching techniques to form the desired interconnection of the elements of the devices into the desired circuits. It should be noted that the substrate contact involving the P+ polycrystalline silicon region 30 is also contacted from the major surface in this metallurgy interconnection pattern which is not illustrated here. The metallurgy can be composed of the various known materials such as aluminum, polycrystalline silicon, metal silicides or combinations thereof.

It is also obvious that other integrated circuits can utilize the pattern of dielectric isolation having the substrate contact element therein. Particularly useful would be a field effect transistor integrated circuit structure. In the case of a field effect transistor integrated circuit the use of the epitaxial layer is optional. Up until the present time epitaxial layers have not generally been used in field effect transistor integrated circuits. However, there are advantages to the use of such an epitaxial layer. Of course, it is not necessary to have a subcollector region 6 in field effect transistor structures such as was utilized in the bipolar transistor integrated circuit structure of the FIGS. 1 through 4. Other useful passive and active integrated circuit devices can be utilized such as resistors, capacitors, diodes and the like within the monocrystalline silicon regions between the pattern of dielectric isolation.

While the invention has been particularly shown and described with reference to the preferred embodiments thereof, it will be understood by those skilled in the art that various changes in form and detail may be made without departing from the spirit and scope of the invention. For example, the recessed dielectric portion could alternatively be filled with silicon dioxide, glass, polysiloxane or the like by any one or a combination of deposition methods such as chemical vapor deposition, sputtering, evaporation, or sedimentation techniques.

What is claimed is:

1. An integrated circuit structure having a semiconductor material body, an integral isolation and substrate contact structure for isolating semiconductor devices from one another, and for providing a conducting path to a substrate common to said semiconductor devices, comprising;

a pattern of embedded isolation structures surrounding said semiconductor devices;

at least one of said embedded isolation structures comprising a combination having a first portion and a second portion, said first portion comprising a shallow recessed oxide portion extending approximately from the surface of said semiconductor material body downward into said semiconductor material body;

said recessed oxide portion having substantially vertical edges, said edges abutting an adjacent one of said semiconductor devices, said second portion comprising a deep portion extending through said recessed oxide portion and extending further into the semiconductor material body to the common substrate of said integrated circuit devices;

said recessed oxide portion being substantially shallower than said deep portion and also substantially surrounding those portions of said deep portion extending through said recessed oxide portion so that a collar of recessed oxide isolation is formed around said deep portion;

an opening through said first and second portions from the surface of said semiconductor material body to said substrate, and a conducting material filling said opening to provide a conducting path to said substrate.

2. The integrated circuit structure of claim 1 wherein said semiconductor material is silicon.

3. The integrated circuit structure of claim 1 wherein said second portion has substantially vertical sidewalls.

4. The integrated circuit structure of claim 1 wherein said conducting material filling the opening in said first and second portions is composed of polycrystalline silicon.

5. The integrated circuit structure of claim 1 wherein said first portion is greater than approximately 1.5 $\mu$m in width and less than approximately 1.5 $\mu$m in depth.

6. The integrated circuit structure of claim 1 wherein said second portion is less than approximately 5 $\mu$m in width and less than approximately 6 $\mu$m in depth.

7. The integrated circuit structure of claim 1 wherein a field effect transistor is located in at least some of said semiconductor material body.

* * * * *